(12) United States Patent
Hu et al.

(10) Patent No.: US 9,980,405 B2
(45) Date of Patent: May 22, 2018

(54) ELECTRICAL MODULES AND MODULAR ELECTRONIC BUILDING SYSTEMS

(71) Applicants: Microduino Inc., Westlake Village, CA (US); Meike Technology (Beijing) Ltd., Beijing (CN)

(72) Inventors: Jian Hu, Westlake Village, CA (US); Kejia Pan, Westlake Village, CA (US); Zhenshan Wang, Westlake Village, CA (US); Xi Li, Westlake Village, CA (US); Bin Feng, Westlake Village, CA (US)

(73) Assignees: Microduino Inc., Westlake Village, CA (US); Meike Technology (Beijing) Ltd., Beijing (CN)

( * ) Notice: Subject to any disclaimer, the term of this patent is extended or adjusted under 35 U.S.C. 154(b) by 0 days. days.

(21) Appl. No.: 15/066,903

(22) Filed: Mar. 10, 2016

(65) Prior Publication Data

US 2017/0150631 A1 May 25, 2017

(30) Foreign Application Priority Data

Nov. 23, 2015 (CN) .............................. 201510815186

(51) Int. Cl.
*H05K 7/02* (2006.01)
*A63H 33/04* (2006.01)
*A63H 33/26* (2006.01)

(52) U.S. Cl.
CPC ........... *H05K 7/023* (2013.01); *A63H 33/042* (2013.01); *A63H 33/046* (2013.01); *A63H 33/26* (2013.01); *H05K 7/026* (2013.01)

(58) Field of Classification Search
CPC ............................... H05K 7/023; H05K 7/026
USPC .......................................................... 361/730
See application file for complete search history.

(56) References Cited

U.S. PATENT DOCUMENTS 7,985,116 B2 * 7/2011 Song ..................... A63H 33/046
446/129
8,873,239 B2 * 10/2014 McRae ................. G06F 1/1656
361/728
9,643,100 B2 * 5/2017 Fein ..................... A63H 33/046
(Continued)

*Primary Examiner* — Tuan T Dinh
*Assistant Examiner* — Rockshana Chowdhury
(74) *Attorney, Agent, or Firm* — Anova Law Group, PLLC

(57) ABSTRACT

The present disclosure provides an electrical module and a modular building system including electrical modules. The electrical module includes a housing member including N pin portions and a connecting portion that connects the N pin portions, where N is greater than 1; N conduction members unconnected with each other; and N magnetic members. Each pin portion is a plate having a through-hole towards its thickness direction, and corresponds to one conduction member and one magnetic member. Each conduction member includes: a first part electrically connected with a lead of an electrical component; and a second part electrically connected with the corresponding magnetic member. Each magnetic member fills the through-hole of the corresponding pin portion, and establishes magnetic connection with a magnetic member of another electrical module in thickness direction to allow the two electrical modules to contact and rotate against each other using a contacting point as a rotation pivot.

11 Claims, 15 Drawing Sheets

(56) References Cited

U.S. PATENT DOCUMENTS

2015/0325949 A1* 11/2015 Wei .................. H01F 7/0263
439/39

* cited by examiner

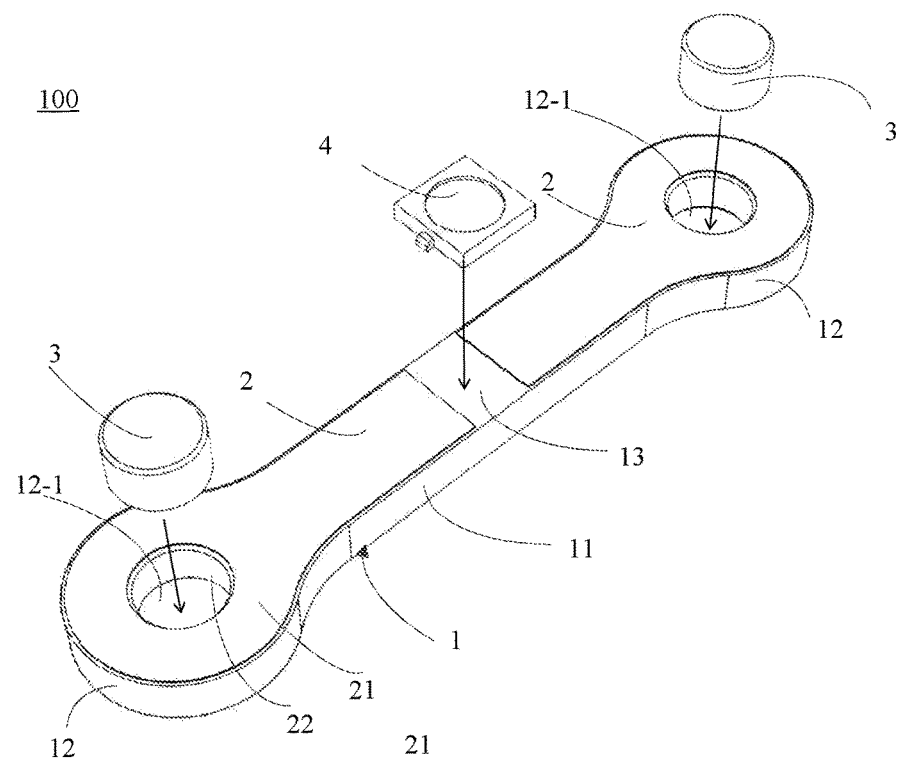
FIG. 3
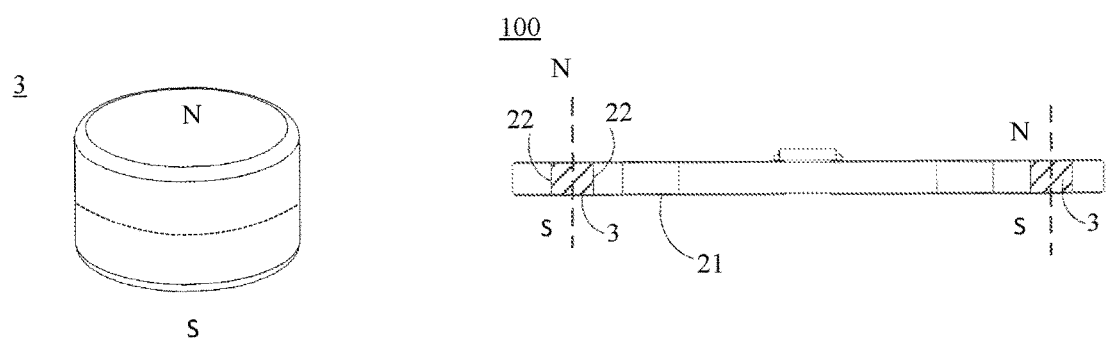
FIG. 4A
FIG. 4B

400a

ELECTRICAL MODULES AND MODULAR ELECTRONIC BUILDING SYSTEMS

CROSS-REFERENCES TO RELATED APPLICATIONS

This application claims priority to Chinese Patent Application No. CN 201510815186.0, filed on Nov. 25, 2015, the entire content of which is incorporated herein by reference.

FIELD OF THE DISCLOSURE

The present disclosure generally relates to the field of electronics and, more particularly, relates to electrical modules, modular electronic building systems, and electrical building products.

BACKGROUND

Nowadays, technological devices are widely used by children and/or adults in their day-to-day life. However, most of them don't know how these devices work, or how to make their own. In fact, there is a big gap between what is taught to an average person and what is used and consumed by that person. It is therefore desirable for children or adults to be able to use functional electrical modules without having to be an expert to program or learn the many complexities involved with these advanced electronics. It is also desirable for children or adults to be able to create their own interactive toys, objects, or products with custom-designed interactive behavior without having to be an expert to program or learn the many complexities involved with these advanced electronics.

Existing electrical modules may be stacked in one direction (vertical or horizontal). However, they cannot be expanded in any other direction(s), and the connection angles between the electrical modules cannot be adjusted. The disclosed electrical modules, modular electronic building systems, and electrical building products are directed to solve one or more problems set forth above and other problems in the art.

BRIEF SUMMARY OF THE DISCLOSURE

According to various embodiments, there is provided an electrical module. The electrical module includes a housing member including N pin portions and a connecting portion that connects the N pin portions, N conduction members unconnected with each other; and N magnetic members. N is an integer equal or greater than 2. Each pin portion is a plate configured to have a through-hole towards a thickness direction of the plate, and corresponds to one conduction member and one magnetic member. Each conduction member includes: a first part on a surface of the housing member electrically connected with a lead of an electrical component; and a second part on an inner wall of the through-hole of the corresponding pin portion electrically connected with the corresponding magnetic member. Each magnetic member is configured to fill the through-hole of the corresponding pin portion, and to establish magnetic connection with a magnetic member of another electrical module in the thickness direction to allow the electrical module and the another electrical module to contact each other and rotate against each other using a contacting point as a rotation pivot.

According to various embodiments, there is also provided another electrical module. The electrical module includes a housing member including two pin portions and a connecting portion that connects the two pin portions; two magnetic members; and two sleeves configured to slide on the two pin portions respectively. Each pin portion is a plate configured to have a through-hole towards a thickness direction of the plate, and corresponds to one magnetic member and one sleeve. Each magnetic member is configured to fill the through-hole of the corresponding pin portion, and to establish magnetic connection with a magnetic member of another electrical module in the thickness direction to allow the electrical module and the another electrical module to contact each other and rotate against each other using a contacting point as a rotation pivot. The magnetic member is configured to extrude out of a top surface of a corresponding pin portion, and extrude out of a bottom surface of the corresponding pin portion. The sleeve covers the top surface and the bottom surface of the corresponding pin portion and exposes a top surface and a bottom surface of the magnetic member.

According to various embodiments, there is also provided a modular electrical building system. The modular electrical building system includes at least two electrical modules including a first module and a second module. Each of the at least two electrical modules including: a housing member including N pin portions and a connecting portion that connects the N pin portions; N conduction members unconnected with each other; and N magnetic members. N is an integer equal or greater than 2. Each pin portion is a plate configured to have a through-hole towards a thickness direction of the plate, and corresponds to one conduction member and one magnetic member. Each conduction member includes: a first part on a surface of the housing member electrically connected with a lead of an electrical component; and a second part on an inner wall of the through-hole of the corresponding pin portion electrically connected with the corresponding magnetic member. Each magnetic member is configured to fill the through-hole of the corresponding pin portion, and to establish magnetic connection between a magnetic member of the first module and a magnetic member of the second module in the thickness direction to allow the first module and the second module to contact each other and rotate against each other using a contacting point as a rotation pivot. Further, each magnetic member is electrically conductive to allow electrical connection between the magnetic member of the first module and the magnetic member of the second module when the magnetic connection is established.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 3 illustrates an exploded view of the exemplary bone-like module consistent with various disclosed embodiments;

FIG. 4A illustrates an exemplary magnetic member for magnetically connecting modules in a modular electronic building system consistent with various disclosed embodiments;

FIG. 4B illustrates a cross section view of the exemplary bone-like module containing the exemplary magnetic member consistent with various disclosed embodiments;

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides an electrical module (also referred to as a "module" or "electrical block" or "block"), and a modular electronic building system including a plurality of (electrical) modules stacked together.

Figure 1:
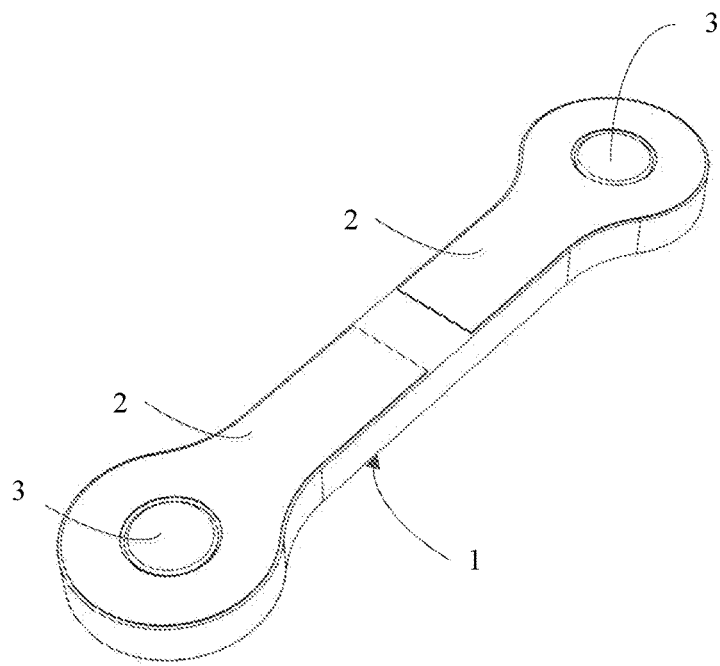
FIG. 1 illustrates a top perspective view of an exemplary base module consistent with various disclosed embodiments.
Figure 2:
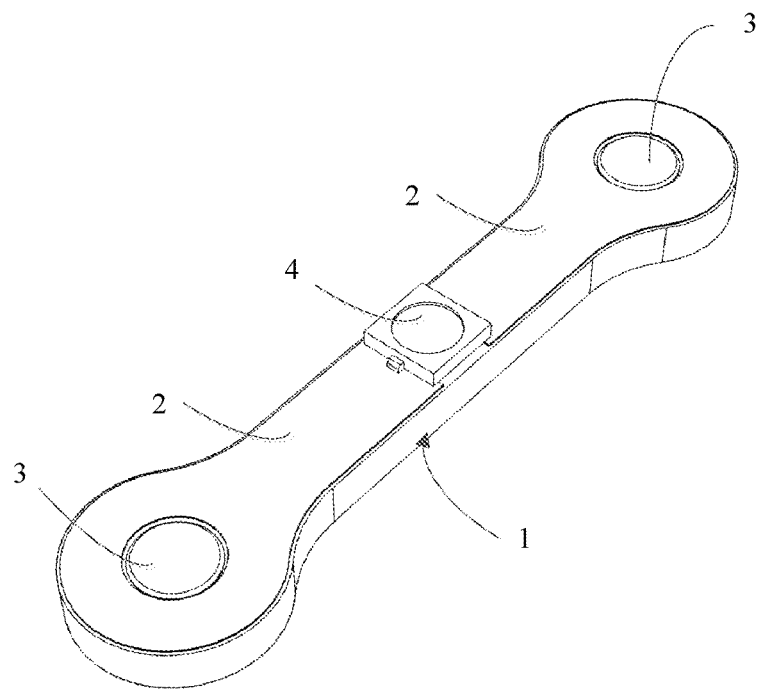
FIG. 2 illustrates a top perspective view of an exemplary bone-like module consistent with various disclosed embodiments.

FIGS. 1-3 illustrate an exemplary bone-like module used to build a modular electronic building system consistent with various disclosed embodiments. As shown, the exemplary bone-like module 100 may include at least a base module 100a including a housing member 1, conduction members 2, and magnetic members 3. The exemplary module 100 may further include an electrical component 4. In some embodiments, the disclosed module may only include the base module 100a. In some embodiments, the disclosed electrical module may include the base module 100a and the electrical component 4 and/or other components. More components can be added and existing components can be modified or omitted. The exemplary module 100 may also be referred to as bone-like module or two-pin module.

The housing member 1 may be a solid supporting structure made of insulating material. In other words, the housing member 1 may be configured as the insulating housing of the electrical module. The shape of the housing member 1 may define the general shape of the electrical module.

Further, the housing member 1 may be the insulated part of a circuit board. The conduction members 2 may be the conducting part of the circuit board. The circuit board may be a printed circuit board (PCB).

The housing member 1 may further include two pin portions 12 at two ends of the housing member 1 and a connecting portion 11 for connecting the two pin portions 12. In some embodiments, the pin portions 12 and the connecting portion 11 may be an integrated structure. That is, the housing member 1 may be a one-piece structure. In some embodiments, the pin portions 12 and the connecting portion 11 may be individual parts that are connected together. The outer contour of the cross section of the pin portion 12 may be have a shape of an arc, a rectangular, a polygon, etc.

The pin portion 12 of the housing member 1 may be configured to have a through-hole 12-1 in a vertical direction (e.g., a thickness direction). As used herein, vertical direction may refer to a direction that goes through the thickness of the plate body of the housing member 1, and also refer to the axial direction of the through-hole 12. In some embodiments, the through-hole 12-1 may be configured at the center of the pin portion 12. The cross-section of the through-hole 12-1 may be circular.

The housing member 1 may enclose one or more magnetic members 3 (e.g., magnets) for providing magnetic connection/bonding between modules. The magnetic member 3 may be molded and securely positioned in each pin portion 12 in a specific arrangement as desired. Specifically, the magnetic member 3 may be configured to fit in the through-hole 12-1 of the pin portion 12. The outer shape of the magnetic member 3 may be compatible with the through-hole 12-1. The thickness of the magnetic member 3 may be the same or greater than the thickness of the pin portion 12. The magnetic member 3 may be manufactured by covering a layer of nickel on the surface of permanent magnet, such that the magnetic member 3 may be both magnetic and conductive.

In some embodiments, the magnetic member 3 may be a solid cylinder. In some embodiments, the magnetic member 3 may be a hollow cylinder. That is, the magnetic member 3 may be configured to have a through-hole in the vertical direction. The cross-section of the through-hole may be round, eclipse, triangle, rectangle, polygon, etc.

Each magnetic member 3 may have a corresponding conduction member 2. As shown in FIGS. 1-3, two conduction members 2 are respectively located at two ends of the housing member 1. The conduction members 2 are not connected with each other. The conduction member 2 may be electrically connected with the magnetic member 3 placed in the through-hole 12-1 of the pin portion 12.

In some embodiments, the conduction member 2 may be a surface layer such as a copper-coated surface layer, a wire, a conductive portion in a printed circuit and other suitable conductive devices.

The conduction member 2 may include a first part 21 on the surface of the housing member 1 and a second part 22 on the inner wall of the through-hole 12-1. The first part and the second part are connected with each other. The first part 21 of the conduction member 2 may be electrically connected with the electrical component 4. The second part 22 of the conduction member 2 may be electrically connected with the magnetic member 3. The first parts 21 of the conduction members 2 are separately located on the surface of the housing member 1 such that the conduction members 2 are not connected to each other. In other words, the housing member 1 may include exposed insulated part 13 that separates the conduction members 2 from each other.

In some embodiments, the first part 21 of the conduction member 2 may be configured on a same side of the housing member (e.g., top surface side). In some embodiments, the first parts 21 of the conduction member 2 may be configured on different sides of the housing member (e.g., the top surface, the bottom surface, and/or the lateral face). In some embodiments, an insulated cover may be configured on top of the first part 21 of the conduction member 2.

As shown in FIGS. 4A and 4B, the exemplary module 100 may include two magnetic members 3 respectively configured inside a through-hole 12-1 of a corresponding pin portion 12. The magnetic member 3 may contact the second part 22 of the conduction member 2 which is the inner wall of the through-hole 12-1. Thus, the magnetic member 3 may be electrically connected to the conduction member 2. In other words, other than being magnetic, the magnetic member 3 may also conduct electricity through its surface.

The magnetic members 3 in each housing member 3 may act as polarizing and locking elements between different modules in the modular electronic building system. For example, substantially all of the magnetic members 3 in each module may have same surface pole on the top surface and same surface pole on the bottom surface of each module.

When the pin portions 12 of two modules tend to be attached and stacked together, only one specific way, i.e., the correct way, may be allowed to magnetically attach the modules together, due to attraction force between opposite poles of magnets in one module and in the next module. With such configurations, it is impossible to wrongly connect two modules (e.g., to wrongly have one module undesirably upside-down), because like poles from two different modules may be repulsed from one another.

As such, the magnetic members 3 may provide magnetic connection/bonding between modules and to connect the modules to form a modular electronic building system. For example, modules may be magnetically connected at their respective pin portions 12 in a vertical direction, by using the magnetic members 3 similarly (or substantially identically) configured within housing members 1 in each module.

Further, when two magnetic members 3 from two modules are attracted or contacted with each other, the two modules may rotate around the magnetic members 3. In some embodiments, the magnetic members being a center of the rotation, the rotation angle may vary from 0 degree to 360 degrees.

Furthermore, when two magnetic members 3 from two modules are magnetically attracted and contacted with each other, the conduction members 2 of the two modules corresponding to the magnetic members 3 may be electrically connected.

The electrical component 4 may be any suitable electrical components that have two leads or two input/output pins used in analog circuits or digital circuits, such as a switch, a wire, light-emitting diodes, a light bulb, a battery, a resistor, a capacitor, an inductor, a motor, a buzzer, a speaker, an optical switch, a variable resistor, an electrical chip, etc.

In some embodiments, the electrical component 4 may be pre-assembled or otherwise integrated with the base module 100a. Further, two leads of the electrical component 4 may be electrically connected with the two conduction members 2, which are respectively electrically connected with the magnetic members 3. Thus, when connecting with other modules, the magnetic members 3 may function as a conducting media in a larger circuit, and the exemplary module 100 may have the same function as the electrical component 4 in the larger circuit.

Figure 5:
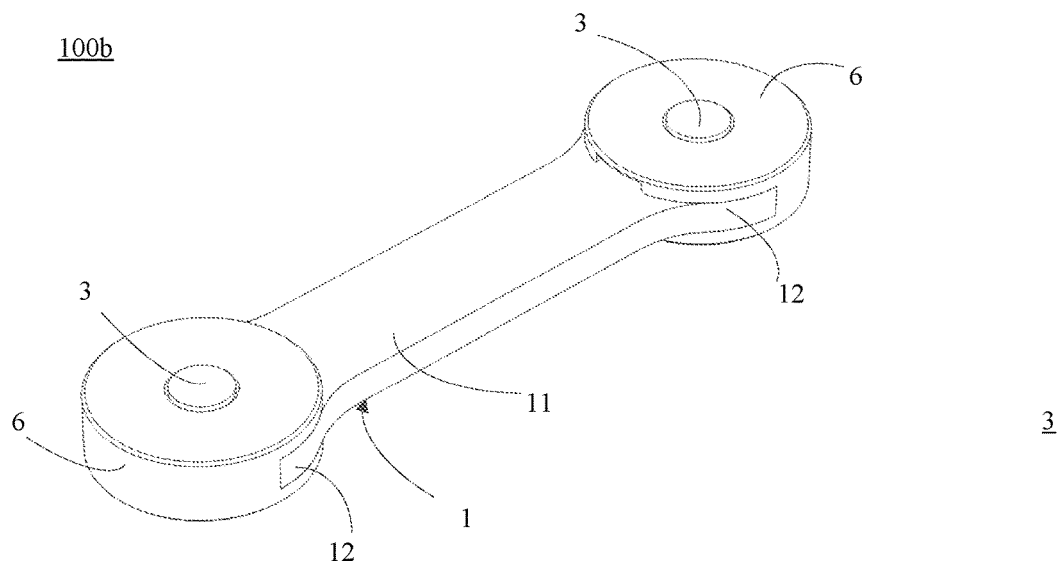
FIG. 5 illustrates a top perspective view of another exemplary base module consistent with various disclosed embodiments.

FIG. 5 illustrates a top perspective view of another exemplary base module consistent with various disclosed embodiments. As shown in FIG. 5, the disclosed bone-like module may be an exemplary base module 100b including a housing member 1, magnetic members 3, and sleeves 6. The housing member 1 may include two pin portions 12 and a connecting portion 11. The two magnetic members 3 are respectively located in the through-holes 12-1 of the pin portions 12. A sleeve 6 may be configured to cover a corresponding pin portion 12 and expose a top surface and a bottom surface of a corresponding magnetic member 3.

Figure 6A:
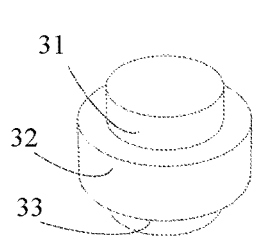
FIG. 6A illustrates another exemplary magnetic member for magnetically connecting modules in a modular electronic building system consistent with various disclosed embodiments.
Figure 6B:
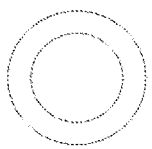
FIG. 6B illustrates a bottom view of the exemplary magnetic member in FIG. 6A consistent with various disclosed embodiments.

FIGS. 6A-6B illustrate an exemplary magnetic member compatible with the base module 100b consistent with various disclosed embodiments. As shown in the figures, the magnetic member 3 may be a specially shaped magnet, and may include an upper magnetic part 31, a middle magnetic part 32, and a lower magnetic part 33.

The height and the cross-section of the middle magnetic part 32 may be compatible with the depth and the cross-section of the through-hole 12-1 in the housing member 1. The radius of the cross-section of the middle magnetic part 32 is greater than that of the upper magnetic part 31 and that of the lower magnetic part 33.

When the magnetic member 3 is assembled in the housing member 1, the upper magnetic part 31 and the lower magnetic part 33 are the parts that extrude out of the top and bottom surface of the housing member 1, respectively. The top surface of the middle magnetic part 32 may be at a same level or a lower level than the top surface of the housing member 1.

It should be noted that, in some embodiment, the cross-section of the through-hole 12-1 and the cross-section of the middle magnetic part 32 are not necessarily circular as long as they have compatible shapes and fit together. For example, the cross-section of the through-hole 12-1 and the cross-section of the middle magnetic part 32 may be eclipse, triangle, rectangle, polygon, etc.

Figure 6C:
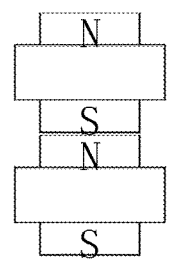
FIG. 6C illustrates a front view of two of the exemplary magnetic members in FIG. 7A stacked together for magnetically connecting modules in a modular electronic building system consistent with various disclosed embodiments.

FIG. 6C illustrates the magnetic members 3 from two modules bonding together due to attraction force between opposite poles of magnets in one module and in another or next module. Further, the two modules may rotate around the magnetic members 3. In other words, the two magnetic members 3 may establish magnetic connection between the two modules in the thickness direction to allow the two modules to contact each other and rotate against each other using their contacting point as a rotation pivot.

FIGS. 7A-7D illustrate an exemplary sleeve 6 of the base module 100b consistent with various disclosed embodiments. As shown in the figures, the sleeve 6 may have a hollow structure compatible with the pin portion 12 of the housing member 1 and the shape of the magnetic member 3. In some embodiments, the sleeve 6 may be plastic. In some embodiments, the sleeve 6 has a hollow cylinder shape.

Specifically, the sleeve 6 may include a top case 61, a bottom case 62, and a side shell 63. The top case 61, the bottom case 62, and the side shell 63 may be a one-piece component. Two central through-holes 64 may be configured coaxially at the center of the top case 61 and the bottom case 62. The radius of the central through-holes 64 may be compatible with the radius of the cross-section of the upper magnetic part 31 and the lower magnetic part 33. The side shell 63 of the sleeve 6 connects the top case 61 and the bottom case 62.

The sleeve 6 further includes a lateral opening 65. The height of the lateral opening 65 may be compatible with the thickness of the pin portion 12 of the housing member 1. In some embodiments, the lateral opening 65 may be open for about 180 degrees. In other words, half of the lateral face of the sleeve 6 is the side shell 63, and the other half of the lateral face of the sleeve is the lateral opening 65. As used herein, the right side of the sleeve 6 refers to the lateral opening 65, and the left side of the sleeve 6 refers to the side shell 63. In some embodiments, the lateral opening 65 may be open for more than about 180 degrees.

An upper groove 66 may be configured to concave the bottom of the top case 61 from the central through-hole 64 to the right edge of the top case 61. The upper groove 66 may be compatible with the upper magnetic part 31. Specifically, the depth of the upper groove 66 is substantially the same as the height of the upper magnetic part 31, and the width of the upper groove 66 is substantially the same as the radius of the upper magnetic part 31. Further, a lower groove 67 may be configured to concave the top of the bottom case 62 from the central through-hole 64 to the right edge of the bottom case 62. The lower groove 67 may be compatible with the lower magnetic part 33.

Figures 7A, 7B, 7C, 7D:
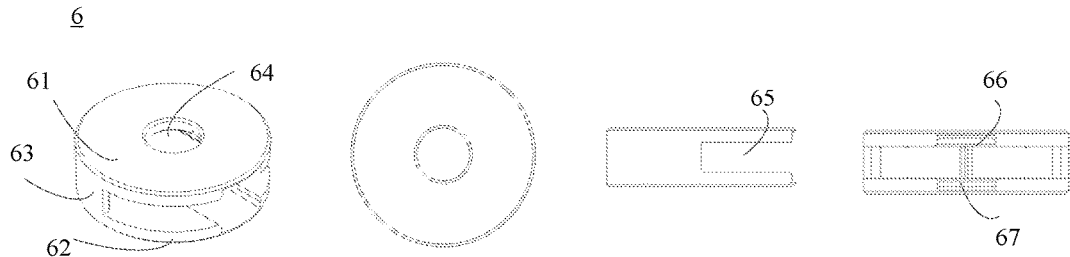
FIG. 7A illustrates a top perspective view of an exemplary sleeve consistent with various disclosed embodiments.
FIG. 7B illustrates a bottom view of the exemplary sleeve in FIG. 7A consistent with various disclosed embodiments.
FIG. 7C illustrates a left view of the exemplary sleeve in FIG. 7A consistent with various disclosed embodiments.
FIG. 7D illustrates a right view of the exemplary sleeve in FIG. 7A consistent with various disclosed embodiments.
Figure 7E:
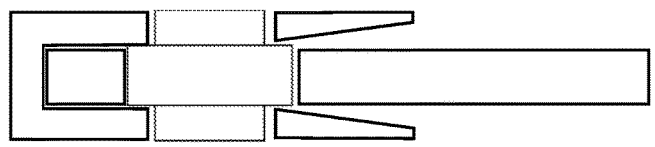
FIG. 7E illustrates a cross-section view of a portion of the exemplary module in FIG. 5 consistent with various disclosed embodiments.

FIG. 7E illustrates a cross-section view of a portion of the base module 100b consistent with various disclosed embodiments. As shown in FIG. 7E, when assembling the sleeve 6, the magnetic member 3 may be slide through the upper groove 66 and the lower groove 67 and elastically fixated in the central through-holes 64. Meanwhile, the movement of the sleeve 6 may be limited by the upper magnetic part 31 and the lower magnetic part 33, thus the sleeve 6 may not be easily slipped out. In some embodiments, the left side of the top case 61 may have uniform thickness and is the same as the height of the upper magnetic part 31. The left side of the bottom case 62 may have uniform thickness and is the same as the height of the lower magnetic part 33. Further, the right side of the top case 61 and the bottom case 63 may have non-uniform thickness, gradually decreasing from the center to the edge.

Figure 8:
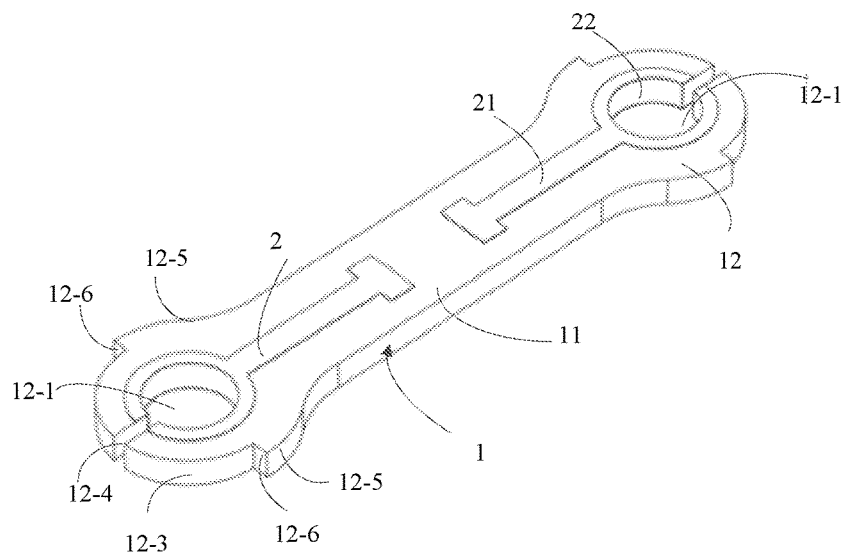
FIG. 8 illustrates a top perspective view of an exemplary printed circuit board (PCB) of the exemplary module in FIG. 5 consistent with various disclosed embodiments.

In some embodiments, the base module 100b may further include conduction members 2. The housing member 1 may be configured as an insulated part of a circuit board. The conduction members 2 may be configured as the conducting part of the circuit board. The circuit board may be a printed circuit board (PCB). FIG. 8 illustrates a top perspective view of an exemplary printed circuit board (PCB) consistent with various disclosed embodiments.

As shown in FIG. 8, the housing member 1 may be the non-conductive substrate of the PCB, provides solid supporting structure of the PCB, and provides the attaching surface for the conduction members 2 (e.g., copper layer). In some embodiments, the housing member 1 may be made of Bakelite insulation material.

The conduction member 2 may include a first part 21 on the surface of the housing member 1 and a second part 22 on the inner wall of the through-hole 12-1. The second part 22 is connected with the first part 21.

The pin portion 12 may further include an edge part 12-3 that forms the edge of the housing member 1 and an inner part 12-5 that connects with the connecting portion 11. The shape of the edge part 12-3 of the pin portion 12 may be a half cylinder including one half of the through-hole 12-1. The shape of the inner part 12-5 of the pin portion 12 may be a half cylinder including the other half of the through-hole 12-1. The radius of the inner part 12-5 is larger than the radius of the edge part 12-3. Thus, two rectangles 12-6 may form at the connecting locations of the inner part 12-3 and the edge part 12-5. The length of the rectangles 12-6 are the same as the thickness of the pin portion 12. The width of the rectangles 12-6 may be compatible with the height of the lateral opening 65 of the sleeve 6.

It should be noted that the pin portion 12 may have shapes other than combined half-cylinders. For example, the shape of the edge part 12-3 of the pin portion 12 may be a half cuboid including one half of the through-hole 12-1, and the shape of the inner part 12-5 of the pin portion 12 may be a half cuboid including the other half of the through-hole 12-1. The length of the inner part 12-5 is larger than the length of the edge part 12-3. Correspondingly, the sleeve may be a hollow cuboid compatible with the pin portion 12.

In some embodiments, the center of the outer rim of the pin portion 12 (i.e., the edge part 12-3) may be configured to have a notch 12-4 in the vertical direction. Further, the notch 12-4 may be through the entire thickness of the pin portion and connected with the through-hole 12-1. The notch 12-4 may provide room for deformation when the magnetic member 3 is inserted into the through-hole 12-1 of the pin portion 12. As such, the magnetic member 3 may be tightly wrapped by the copper layer on the inner wall (i.e., the second part 22 of the conduction member 2), and the conduction between the magnetic member 3 and the conduction member 2 may be ensured. Further, the notch 12-4 may be used to indicate proper position of the sleeve 6 during assembly. The shape of the notch 12-4 may be triangle, square, rectangle, etc.

Other aspects of the base module 100b may function in a similar way as described in the base module 100a.

Figure 9:
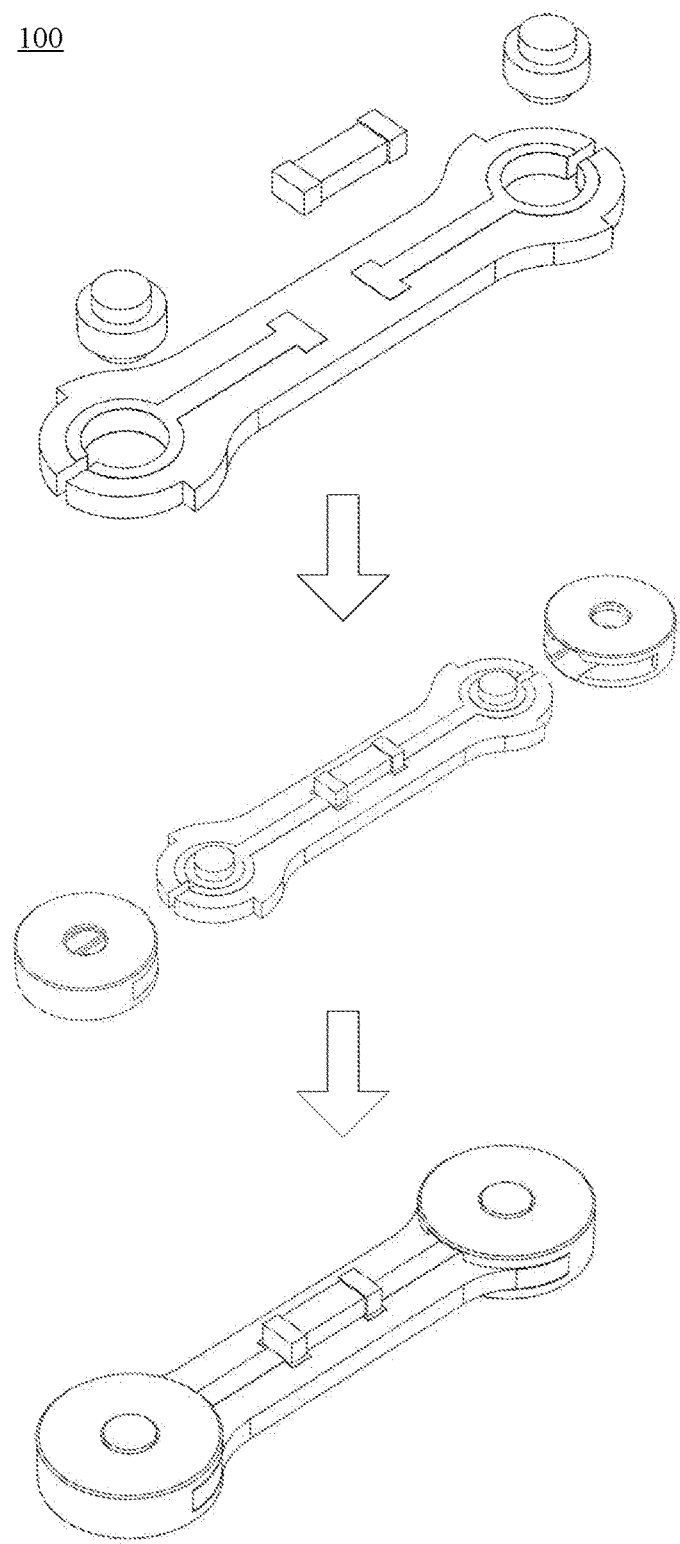
FIG. 9 illustrates installation steps of the exemplary module in FIG. 5 consistent with various disclosed embodiments.

The disclosed bone-like module 100 may include the base module 100b and an electrical component 4. FIG. 9 illustrates installation steps of an exemplary module consistent with various disclosed embodiments. As shown in FIG. 9, the two magnetic members 3 may be respectively inserted into the two through-holes 12-1 of the pin portions 12 of the housing member 1. Further, the electrical component 4 (e.g., a resistor) may be installed with each lead soldered on the two conduction members 2. In some embodiments, the conduction members 2 may include suitable solder pads for welding the electrical component 4.

The two sleeves 6 may be slide on the two pin portions 2. During assembly, the lateral opening 65 of the sleeve 6 may be aligned with the pin portion 12, the upper groove 66 and the lower groove 67 may be aligned with the notch 12-4 of the pin portion 12.

After the assembly is complete, each sleeve 6 may cover the top surface and the bottom surface of the corresponding pin portion 12, and wrap around the lateral face of the upper magnetic part 31 and the lower magnetic part 33 of the corresponding magnetic member 3. Further, each lead of the electrical component 4 may be electrically connected with a corresponding magnetic member 3 through the conduction member 2.

Figure 10A:
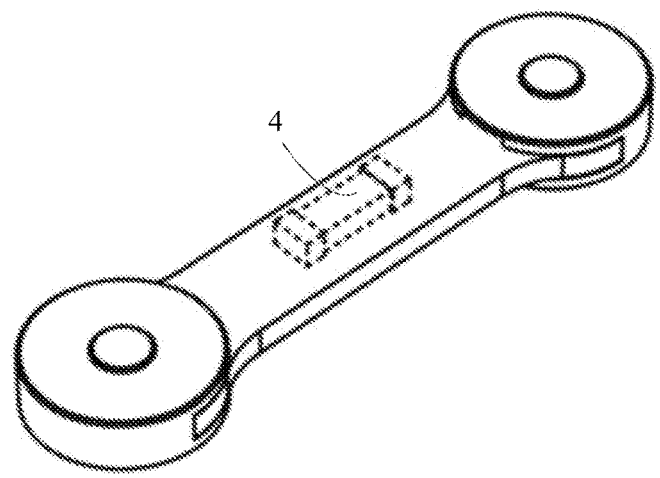
FIGS. 10A-10C illustrate three variations of electrical components of the exemplary module in FIG. 5 consistent with various disclosed embodiments.
Figure 10B:
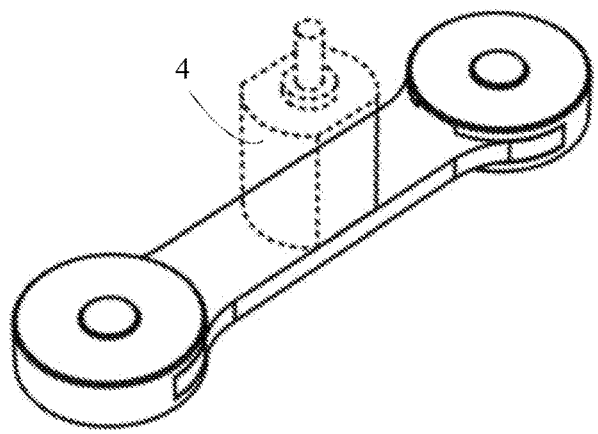
Figure 10C:
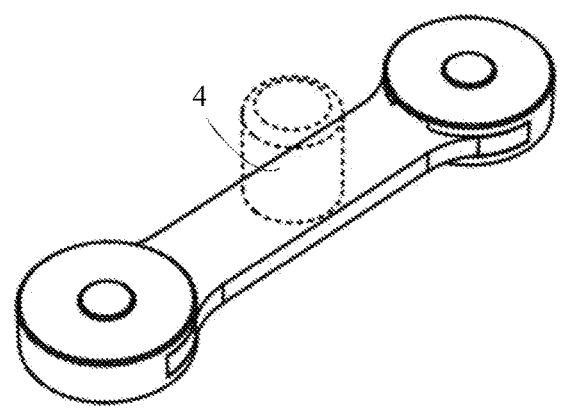

FIG. 10A-10C illustrate three variations of exemplary electrical components consistent with various disclosed embodiments, including a resistor, a motor, and a capacitor. The electrical components are shown in dotted lines. In other embodiments, the electrical component 4 may be any suitable electrical components with two leads or two input/output ends used in analog circuits or digital circuits, such as a switch, a wire, light-emitting diodes, a light bulb, a battery, a resistor, a capacitor, an inductor, a motor, a buzzer, a speaker, an optical switch, a variable resistor, an electrical chip, etc.

In some embodiments, the housing member 1 may have uniform thickness and may be a plate having top surface and bottom surface configured in parallel, as shown in previous figures. In other embodiments, the housing member 1 may not have uniform thickness. In some embodiments, the thickness of the pin portions 12 may be different. In some embodiments, the connection portion 11 may have an irregular shape such as an arch shape. For example, FIGS. 11A-11B illustrate front views of two variations of the exemplary housing member consistent with various disclosed embodiments.

Figure 11A:
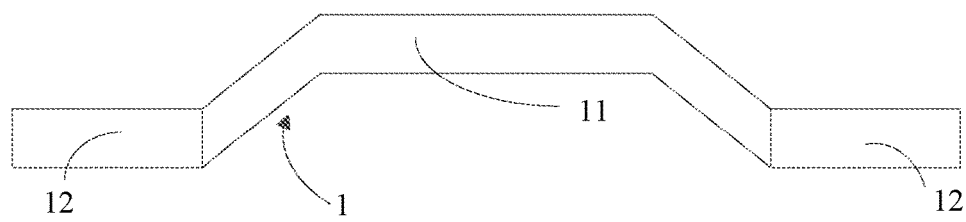
FIGS. 11A-11B illustrate front views of two variations of exemplary housing members consistent with various disclosed embodiments.
Figure 11B:
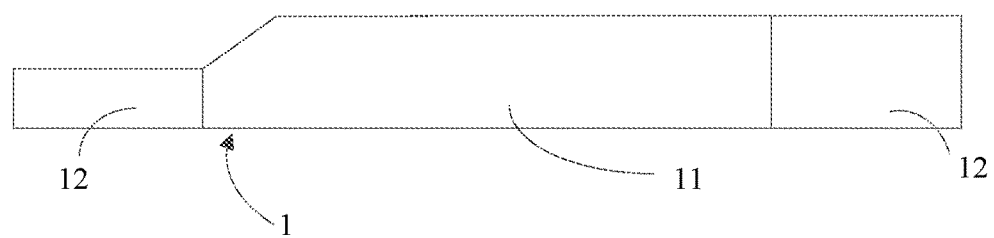

As shown in FIG. 11A, the two pin portions 12 of the housing member 1 have the same thickness, and the connecting portion 11 has a symmetrical bridge shape with a higher flat center and two slanting legs connecting to the two pin portions 12. As shown in FIG. 11B, the housing member 1 may have a step-like shape. The pin portion 12 on the right is thicker than the pin portion 12 on the left. The front view of the connecting portion 11 may be a rectangle with a missing top left corner.

Further, the housing member 1 may be manufactured with various shapes to enable creative designs of users. In some embodiments, as long as the cross-section of the through-holes 12-1 of the pin portions have substantially the same shape, and the magnetic members 3 can form magnetic and electrical connections between two modules, the housing member 1 may have any suitable shapes.

Further, with similar design principle, the disclosed two-pin module may be expanded to modules with more than two pins. The housing member 1 may include a plurality of pin portions 12 and a connecting portion 11 that connects the pin portions. The number of pin portions is usually between 2 to 10. The base module may be referred to as a multi-pin base module. The corresponding electrical module may be referred to as multi-pin electrical module.

Figure 12:
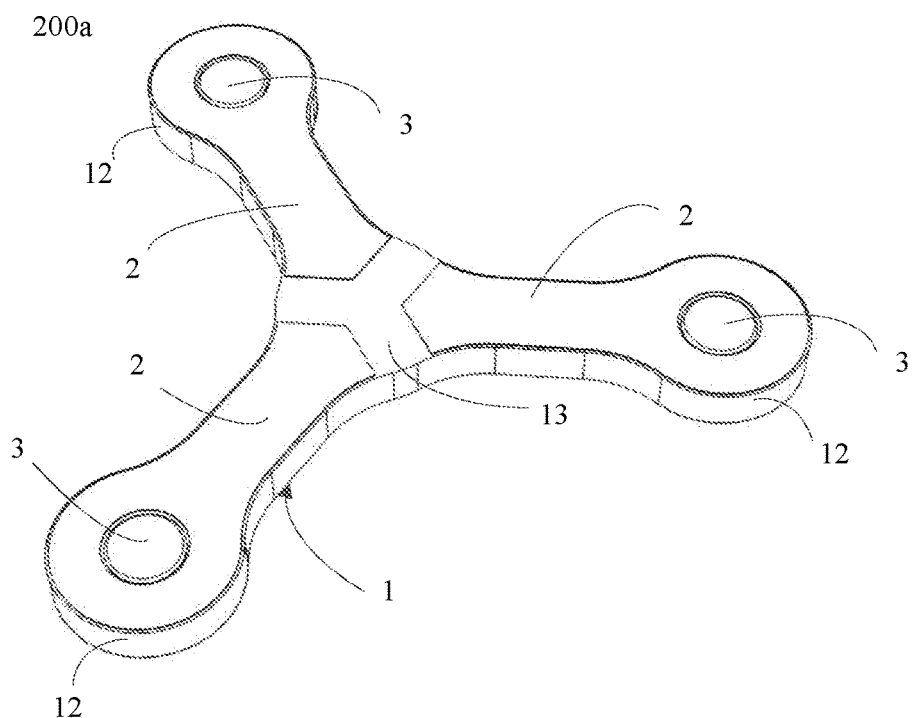
FIG. 12 illustrates a perspective view of an exemplary Y-shaped module consistent with various embodiments.

FIG. 12 illustrates a perspective view of an exemplary Y-shaped module consistent with various embodiments. As shown in FIG. 12, the Y-shaped module 200 may be a three-pin base module 200a including a housing member 1, three conduction members 2 and three magnetic members 3. The housing member 1 may include three pin-portions 12 and a Y-shaped connecting portion 11. The Y-shaped module 200 may further include an electrical component 4. In some embodiments, the pin portions 12 and the connecting portion 11 are built as a one-piece plate.

In some embodiments, the housing member 1 may have a rotationally symmetric shape. Specifically, the branches of the Y-shaped connecting portion 11 have same shape and locate at evenly distributed angles (i.e., about 120 degrees between neighboring branches). The center of the rotational symmetric shape is the center of the housing member 1 and the center of the Y-shaped connecting portion 11. The three pin-portions 12 have same size and shape and locate at the free ends of its corresponding branch. Each pin portion 12 may be configured to have a through-hole 12-1 in the vertical direction to place its corresponding magnetic member 3.

In some embodiments, the branches of the Y-shaped connecting portion 11 may have different length or shape, and form other kinds of Y-shaped housing member 1. In some embodiments, the branches of the Y-shaped connecting portion 11 may locate at unevenly distributed angles (e.g., 60°, 150°, and 150°), and form other kinds of Y-shaped housing member 1.

Each conduction member 2 may correspond to one pin portion 12 and one magnetic member 3. The conduction member 2 may include a first part 21 on the surface of the housing member 1 and a second part 22 on the inner wall of the through-hole 12-1. The first part and the second part are connected. Each conduction member 2 are not connected to each other. The housing member 1 may include insulated part 13 that separates the conduction members 2 from each other.

Each magnetic member 3 may be located in the through-hole 12-1 of corresponding pin portion 12. The magnetic member 3 is electrically connected to the corresponding conduction member 2 on the surface of the inner wall of the through-hole 12-1. The three-pin module may be magnetically and electrically connected with other disclosed modules. The magnetic member 3 may have similar design as the magnetic member shown in FIGS. 4A and 4B.

The electrical component 4 may be any suitable electrical components that have three leads or three input/output pins used in analog circuits or digital circuits, such as a transistor, a field-effect transistor (FET), a single pole, double throw (SPDT) switch, etc. The three leads of the electrical component 4 may be respectively connected to the three pin portions 12. When the three-pin module 200 is connected in a circuit, the function of the electrical component 4 may be realized.

Figure 13:
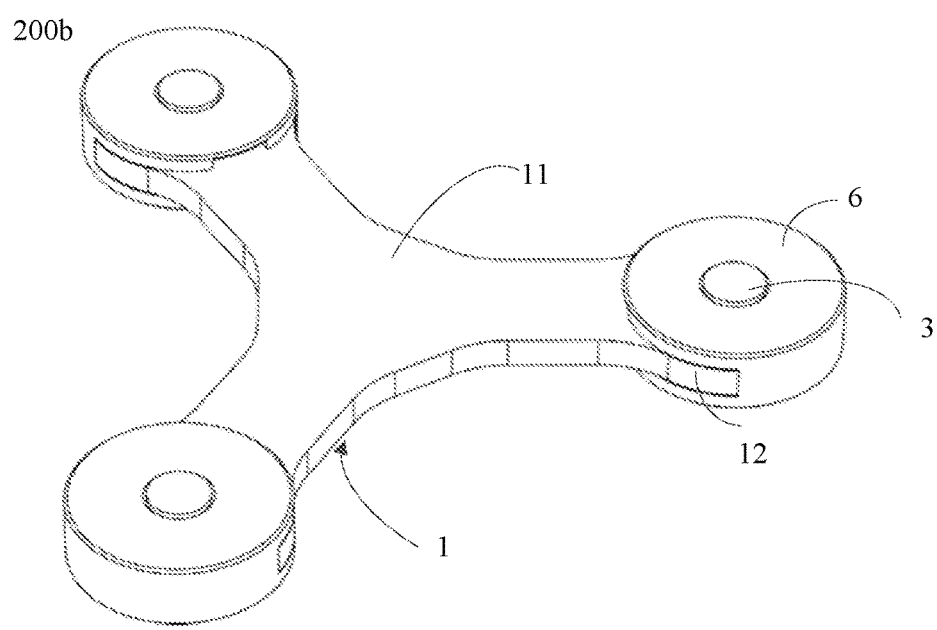
FIG. 13 illustrates a perspective view of another exemplary Y-shaped module consistent with various embodiments.

FIG. 13 illustrate a perspective view of another exemplary Y-shaped module consistent with various embodiments. As shown in FIG. 13, the disclosed Y-shaped module 200 may be a three-pin base module 200b including a housing member 1, three magnetic members 3, and three sleeves 6. In some embodiments, the three-pin base module 200b may further include conduction members 2. The magnetic members 3 may have similar design as the magnetic member shown in FIGS. 6A and 6B. The sleeves 6 may have similar design as the sleeve shown in FIGS. 7A-7E. The housing member 1 may include three pin-portions 12 and a Y-shaped connecting portion 11. The pin portions 12 and conduction members 2 may have similar design as the base module 100b shown in FIG. 8.

Other aspects of the base module 200b may function in a similar way as described in the base module 200a.

Figure 14:
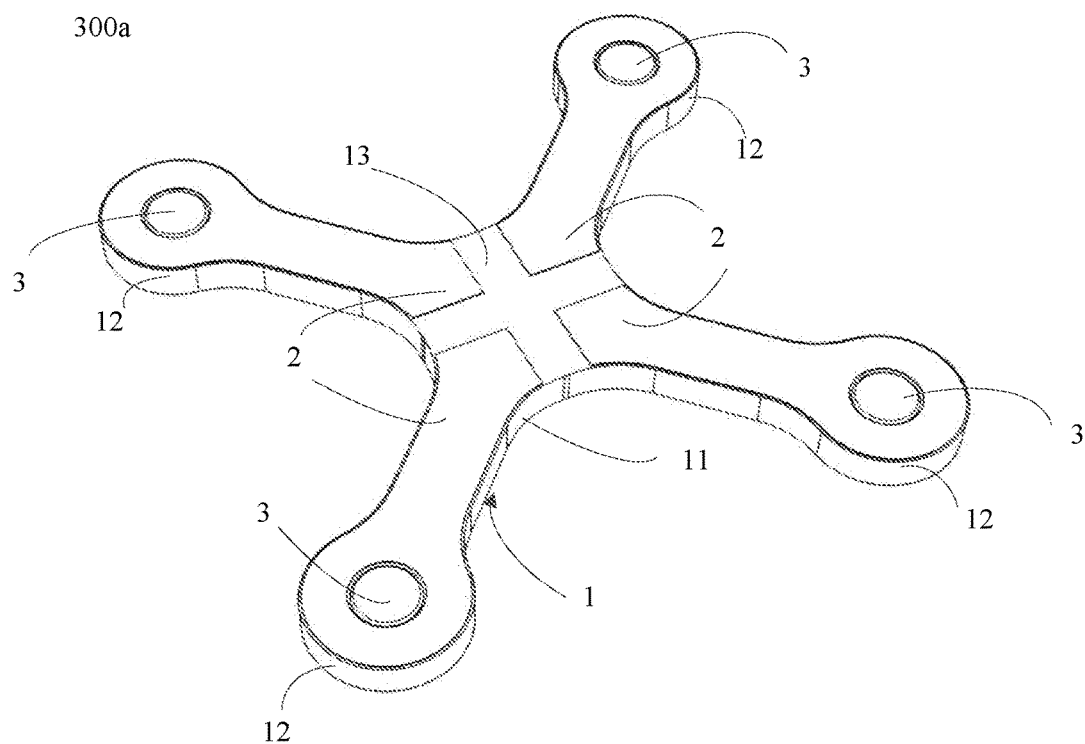
FIG. 14 illustrates a perspective view of an exemplary cross-shaped module consistent with various embodiments.

FIG. 14 illustrate a perspective view of an exemplary cross-shaped module consistent with various embodiments. As shown in FIG. 14, an exemplary cross-shaped module 300 may be a four-pin base module 300a including a housing member 1, four conduction members 2 and four magnetic members 3. The housing member 1 may include four pin-portions 12 and a cross-shaped connecting portion 11. The cross-shaped module 300 may further include an electrical component 4. In some embodiments, the pin portions 12 and the connecting portion 11 are built as a one-piece plate.

In some embodiments, the housing member 1 may have a rotationally symmetric shape. Specifically, the branches of the cross-shaped connecting portion 11 have same shape and locate at evenly distributed angles. For example, each pair of neighboring branches may form a 90-degree angle. In another example, the neighboring branches may sequentially form angles at 60°, 120°, 60°, and 120°. The center of the rotational symmetric shape is the center of the housing member 1 and the center of the cross-shaped connecting portion 11. The four pin-portions 12 have same size and shape and locate at the free ends of its corresponding branch. Each pin portion 12 may be configured to have a through-hole 12-1 in the vertical direction to place its corresponding magnetic member 3.

In some embodiments, the branches of the cross-shaped connecting portion 11 may have different length or shape, and form other kinds of cross-shaped housing member 1. In some embodiments, the branches of the cross-shaped connecting portion 11 may locate at unevenly distributed angles (e.g., 30°, 60°, 150°, and 120°), and form other kinds of cross-shaped housing member 1.

The conduction members 2 and the magnetic members 3 may be designed in a similar way as the two-pin modules 100 and three-pin modules 200. Thus, the four-pin module 300 may be magnetically and electrically connected with other disclosed modules.

The electrical component 4 may be any suitable electrical components that have four leads or four input/output pins used in analog circuits or digital circuits. The four leads of the electrical component 4 may be respectively connected to the four pin portions 12. When the four-pin module 300 is connected in a circuit, the function of the electrical component 4 may be realized.

Figure 15:
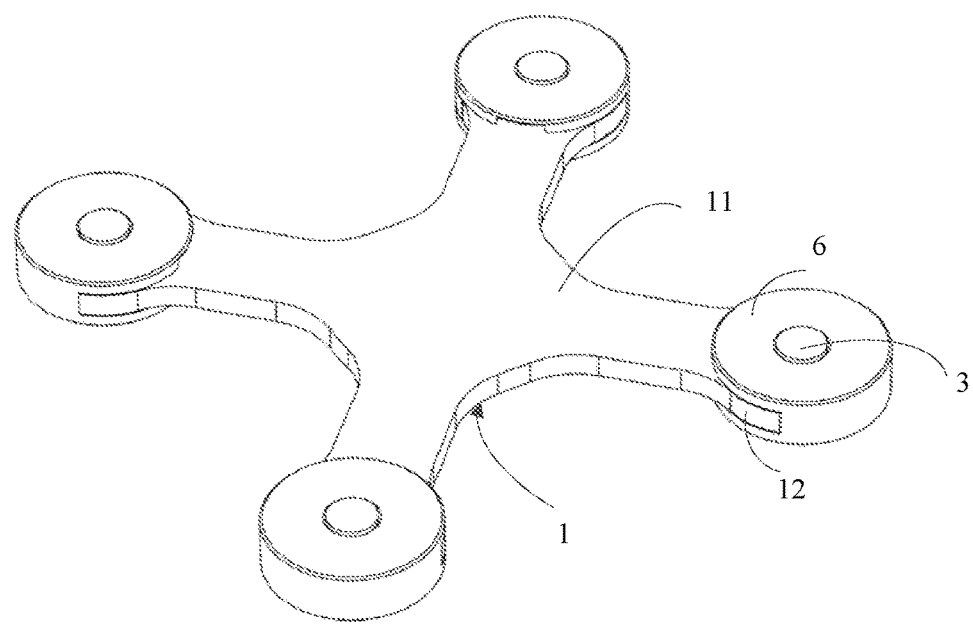
FIG. 15 illustrates a perspective view of another exemplary cross-shaped module consistent with various embodiments.

FIG. 15 illustrate a perspective view of another exemplary cross-shaped module consistent with various embodiments. As shown in FIG. 15, the disclosed cross-shaped module 300 may be a four-pin base module 300b including a housing member 1, four magnetic members 3, and four sleeves 6. In some embodiments, the four-pin base module 300b may further include conduction members 2. The magnetic members 3 may have similar design as the magnetic member shown in FIGS. 6A and 6B. The sleeves 6 may have similar design as the sleeve shown in FIGS. 7A-7E. The housing member 1 may include four pin-portions 12 and a cross-shaped connecting portion 11. The pin portions 12 and conduction members 2 may have similar design as the base module 100b shown in FIG. 8. Other aspects of the base module 300b may function in a similar way as described in the base module 300a.

Similarly, other embodiments may include other multi-pin modules such as five-pin modules and six-pin modules. In some embodiments, the cross-section of the housing member may have a rotationally symmetric shape. And, for a multi-pin module that have N pins (N is an integer greater than 2), an angle formed between two neighboring pin portions at the center of the housing member is about 360/N degrees.

The electrical component 4 may have the same number of pins as the number of conduction members 2 of the multi-pin module. In some embodiments, the base module (the housing member 1, the conduction members 3, and the magnetic members 3) may be provided first, and the electrical component 4 may later be connected to the conduction members 2 (e.g., by welding or soldering) to provide a multi-pin electrical module. In fact, any suitable electrical components can be pre-assembled or otherwise integrated onto the PCB of a corresponding module, which can then be stacked into a modular electronic building system. Non-limiting examples of the electrical components may include, microcontroller unit (8 bit, 16 bit, and 32 bit) (e.g., in FIGS. 7-9), ARM CPU, MIPS CPU, USB2TTL (e.g., in FIGS. 10-11), Ethernet, RS485, USB host, 2.4 GHz Wireless, 433 MHz Wireless, 866 MHz Wireless, 950 MHz Wireless, WiFi, Bluetooth, Zigbee, NFC, Micro SD, GPS, GPRS/GSM, 4G/LTE, wireless power charger, MP3 decoder, Amplifier, OLED, motor driver, stepper driver, RTC, accelerometer, gyroscope, magnetic field strength, Li-ion battery manager, double connect board, Arduino to Microduino pinout convert, galvanic skin sensors, arsenic detectors, resistors, capacitors, inductors, and/or configured in a same or different modules for making a desired modular electronic building system.

Figure 16:
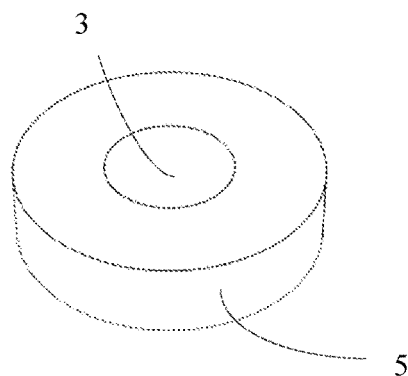
FIG. 16 illustrates a perspective view of an exemplary filler module consistent with various disclosed embodiments.

FIG. 16 illustrates an exemplary filler module consistent with various disclosed embodiments. As shown in FIG. 16, the exemplary filler module 400a is compatible with the base module 100a, 200a, and 300a. The filler module 400a may include a housing body 5 and a magnetic member 3. The housing body 5 may be a cylinder with a through-hole 5-1 configured in the center. The magnetic member 3 may be configured to fit in the through-hole 5-1. The magnetic member 3 may have a same design as the magnetic member 3 of the base module 100a shown in FIGS. 3A-3B. In some embodiments, the filler module 400a may further include a conduction member 2 (not shown). The conduction member 2 may be attached on the surface of the housing body 5 and the inner wall of the through-hole 5-1 to facilitate electricity conduction.

Figure 17A:
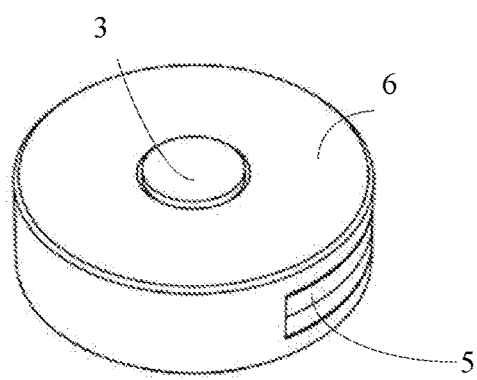
FIG. 17A illustrates a perspective view of another exemplary filler module consistent with various disclosed embodiments.
Figure 17B:
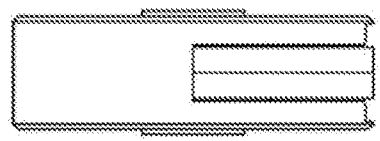
FIG. 17B illustrates a front view of the exemplary filler module in FIG. 17A consistent with various disclosed embodiments.
Figure 17C:
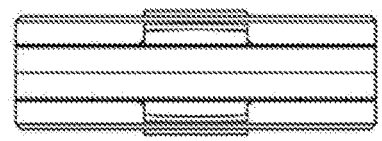
FIG. 17C illustrates a side view of the exemplary filler module in FIG. 17A consistent with various disclosed embodiments.

FIGS. 17A-17C illustrate another exemplary filler module consistent with various disclosed embodiments. As shown in the figures, the exemplary filler module 400*b* is compatible with the base module 100*b*, 200*b*, and 300*b*. The filler module 400*b* may include a housing body 5, a magnetic member 3, and a sleeve 6. The housing body 5 may be a cylinder with a through-hole 5-1 configured in the center. The magnetic member 3 may be configured to fit in the through-hole 5-1. The magnetic member 3 may have a same design as the magnetic member 3 of the base module 100*b* shown in FIGS. 6A-6B. The sleeve 6 may have same design as the sleeve 6 compatible for pin portions 12 in the base module 100*b* as shown in FIGS. 7A-7D.

The filler module 400 (e.g., 400*a* or 400*b*) may be used as a filler unit that connects other modules in a modular system. The filler module may have similar shape and structure as a single pin portion 12 of the housing member 1 in the corresponding module (e.g., 100*a* or 100*b*). The filler module 400 may be connected to a pin portion 12 of a multi-pin module or another filler module on its top side, and connected to a pin portion 12 of another multi-pin module or another filler module on its bottom side, through the attraction force between the magnetic members 3 of the pin portions and filler modules.

Further, in some embodiments, the filler module may allow electrical conduction from the connected module. In some embodiments, the magnetic member 3 of the filler module may be covered with insulated materials such that the filler module may block electrical conduction from the connected module.

When building a modular system, two to-be-connected pin portions 12 from two multi-pin modules may locate at a same horizontal position but at different height in the vertical direction. The filler module may be placed in between two multi-pin modules whose pin portions 12 locate at a same horizontal spot but are not contacted in the vertical direction to compensate the vertical distance. Thus, the two pin portions 12 may be magnetically connected indirectly through one or more filler modules. Further, the one or more filler modules may facilitate or block the electrical connection of the two pin portions 12 as desired.

Figure 18A:
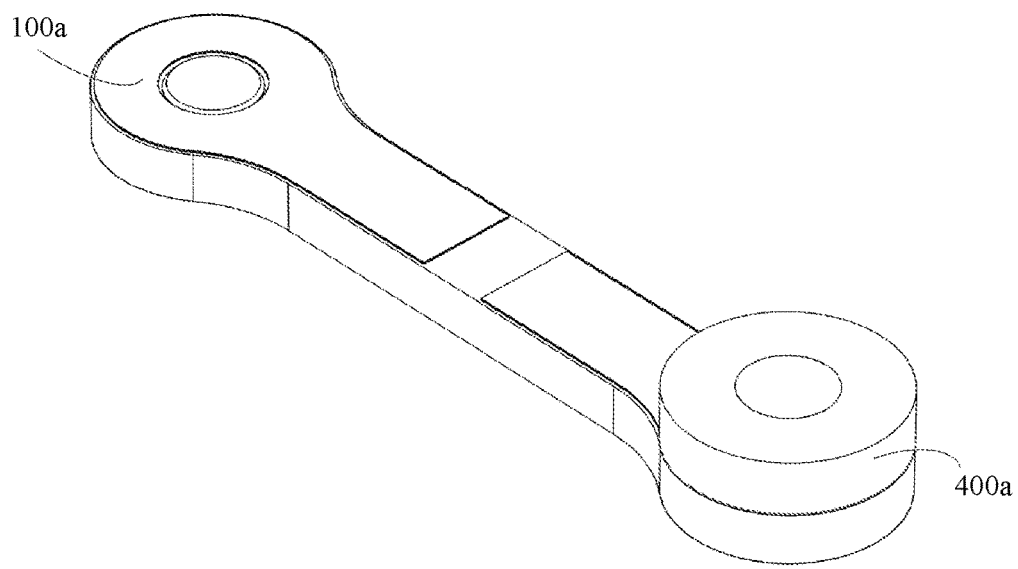
FIG. 18A illustrates a modular building system including the exemplary filler module in FIG. 16 consistent with various disclosed embodiments.
Figure 18B:
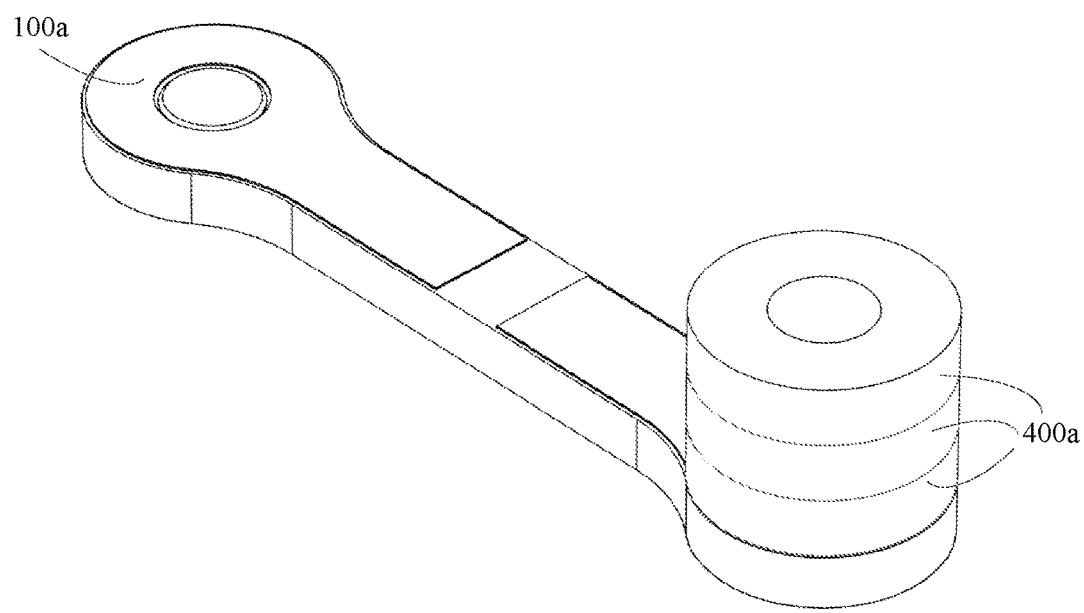
FIG. 18B illustrates a modular building system including three of the exemplary filler modules in FIG. 16 consistent with various disclosed embodiments.

FIGS. 18A-18B illustrate two exemplary modular building system including one or more filler modules consistent with various disclosed embodiments. As shown in both FIG. 18A and FIG. 18B, the filler module 400*a* have compatible shape and size as the pin portion 12 of the base module 100*a*. As shown in FIG. 18A, one filler module 400*a* is stacked on top of a pin portion 12 in the vertical direction under the attractive force of the magnetic member 3. As shown in FIG. 18B, three filler modules 400*a* are stacked on top of a pin portion 12 in the vertical direction under the attractive force of the magnetic members 3.

The filler module may have same or different thickness than the exemplary module depending on practical situations to build desired modular system. The modules and filler modules illustrated in FIGS. 18A and 18B have uniform thickness. The uniform thickness may be referred to as one height level. FIG. 18A illustrates a modular building system including one filler module which adds one height level to the base module. FIG. 18B illustrates a modular building system including three filler modules which add three height levels to the base module.

The present disclosure provides a modular electronic building system including a plurality of (electrical) modules connected together. The plurality of electrical modules may be the multi-pin modules and filler modules described above. Each multi-pin module in the modular electronic building system performs one or more discrete functions (e.g., an LED, a pushbutton, a light sensor, etc.), and the multi-pin modules and filler modules can be combined to create larger circuits. Some module may respond to external events such as mechanical forces, touch, proximity, radio frequency signals, environmental conditions, etc. Other modules may be pre-programmed to be, for example, synthesizers, oscillators, etc. Still other modules may be simply used to pass current like wire modules. Yet other modules may provide current to be, for example, power blocks/modules. The system may further include, for example, adapter boards to other electronic block building systems and interfaces.

The pin portions 12 of the multi-pin modules (e.g., module 100*b*, 200*b*, 300*b*) in the modular electronic building system may be stacked vertically under the magnetic force of the magnetic members 3 at their respective pin portions 12. Further, the magnetic members 3 may further conduct electricity between the connected modules such that the connected modules are electrically connected. Moreover, a filler module (e.g., 400*b*) may be stacked vertically with another filler module or a pin portion 12 of the multi-pin module under the attraction force of their respective magnetic members 3.

In some embodiments, a plurality of multi-pin modules and/or filler modules in the modular electronic building system may include pin portions 12 and/or housing body 5 with same thickness and compatible shapes, and may include magnetic members 3 with substantially same size and shape. Thus, it is convenient to arrange and connect these modules and make bigger circuits. Further, the connecting portion 11 of modules with same pins may have same shape to facilitate various arrangements of the modules. The branches of the connecting portion 11 of modules with different pins may have same width to facilitate various arrangements of the modules.

In some embodiments, the magnetic members 3 of the modules may have through-holes in the vertical direction. The hollow structure of the magnetic member 3 in each module allow easy fix and stacking of the pin portion 12 of any number of modules and/or filler modules, e.g., by passing a nylon string or a standard screw, such as an M3 screw, through corresponding hollow structures of the magnetic members in the modules. This further locks positions of a desired number of modules in the disclosed modular electric building block system.

Figure 19:
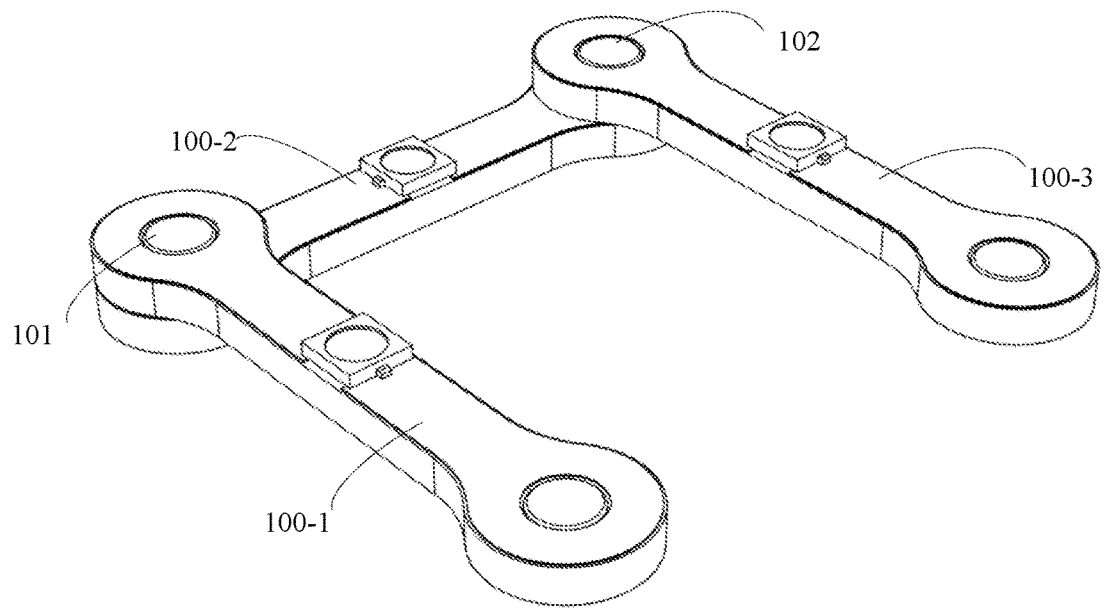
FIG. 19 illustrates a perspective view of an exemplary modular electronic building system consistent with various disclosed embodiments.

FIG. 19 is a perspective view of an exemplary modular electronic building system. As shown in FIG. 19, the exemplary system may include three bone-like modules 100-1, 100-2, and 100-3. The base module of the three bone-like modules may be module 100*a*. Through their respective magnetic members 3 at the pin portions 12, module 100-1 and module 100-2 are magnetically attracted and contacted at point 101. Further, module 100-1 and module 100-2 are electrically connected. Similarly, module 100-2 and module 100-3 are magnetically connected and electrically connected at point 102. Thus, module 100-1, 100-2, and 100-3 have a series connection. FIG. 19 illustrates the modular building system where the three modules are connected at a 90-degree angle. In various embodiments, module 100-1 may use point 101 as a pivot point to rotate and form any desired angle with module 100-2. Similarly, module 100-3 may use point 101 as a pivot point to rotate and form any desired angle with module 100-2.

Figure 20:
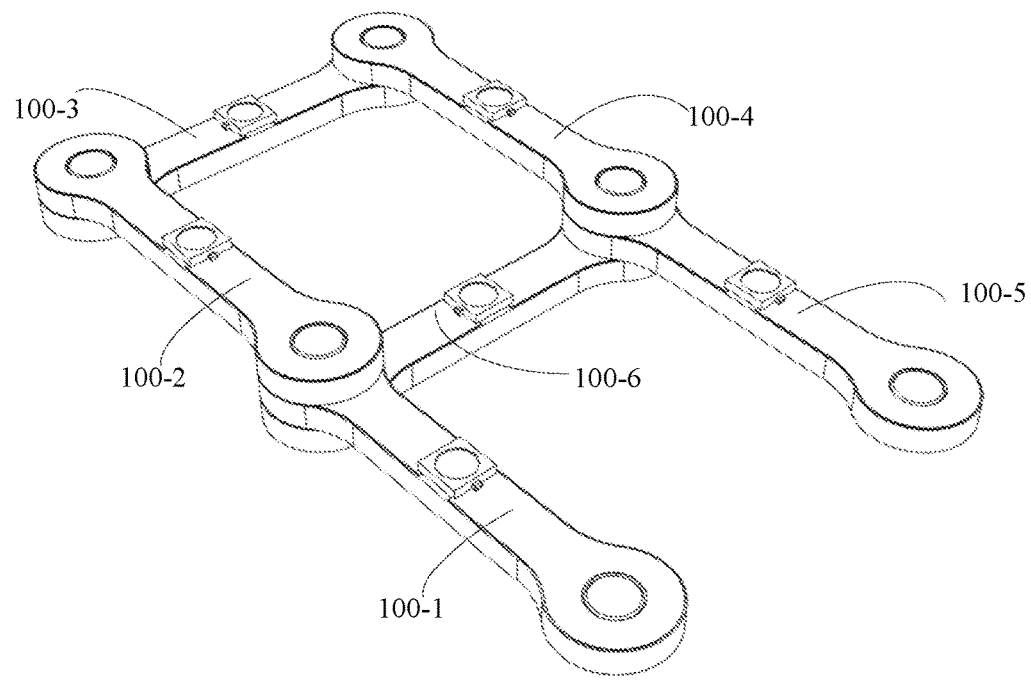
FIG. 20 illustrates a perspective view of another exemplary modular electronic building system consistent with various disclosed embodiments.

FIG. 20 is a perspective view of an exemplary modular electronic building system. As shown in FIG. 20, the exemplary system may include six bone-like modules 100-1 to 100-6. The base module of these bone-like modules may be module 100a. Modules 100-2, 100-3, and 100-4 have a series connection, and together have a parallel connection with module 100-6. FIG. 20 illustrates the modular building system where the modules 100-2, 100-3, 100-4, and 100-6 form a square-shape circuit. In various embodiments, because of flexible nature of quadrilaterals, these four modules may form any desired quadrilateral with desired angles, such as a parallelogram when the modules have same length.

In some embodiments, the six modules may have uniform thickness. The exemplary system shown in FIG. 20 may have three height levels, with modules 100-2 and 100-4 at the highest level, modules 100-1, 100-3, and 100-5 at the middle level, and module 100-6 at lowest level.

Figure 21:
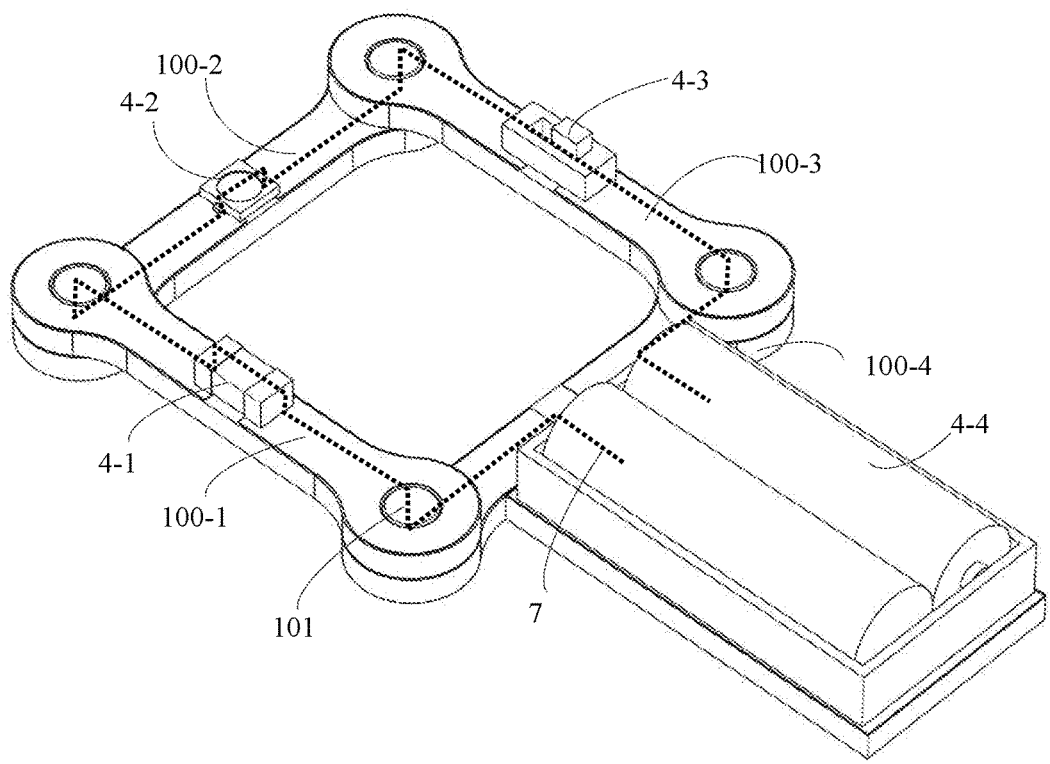
FIG. 21 illustrates a perspective view of another exemplary modular electronic building system consistent with various disclosed embodiments.

FIG. 21 is a perspective view of an exemplary modular electronic building system. As shown in FIG. 21, the exemplary system may include four bone-like modules 100-1 to 100-4 sequentially connected in series. The base module of the bone-like modules may be module 100a. The electrical component 4-1 of module 100-1 may be a resistor, the electrical component 4-2 of module 100-2 may be an LED light, the electrical component 4-3 of module 100-3 may be a switch, and the electrical component 4-4 of module 100-4 may be a battery pack. When the switch of module 100-3 is turned on, the circuit is powered on. The dotted line illustrates current flow 7 in the circuit, which starts from module 100-4 (i.e., battery pack), sequentially passes through module 100-1 (i.e., resistor), module 100-2 (i.e., the LED light), 100-3 (i.e., the switch), and flows back to module 100-4. Module 100-1 and 100-4 are both physically connected and electrically connected at point 101 through their respective magnetic members 3 in the pin portions 12. Similarly, any two neighboring modules are both physically connected and electrically connected. Thus, the LED light lights up when the switch is on.

Figure 22:
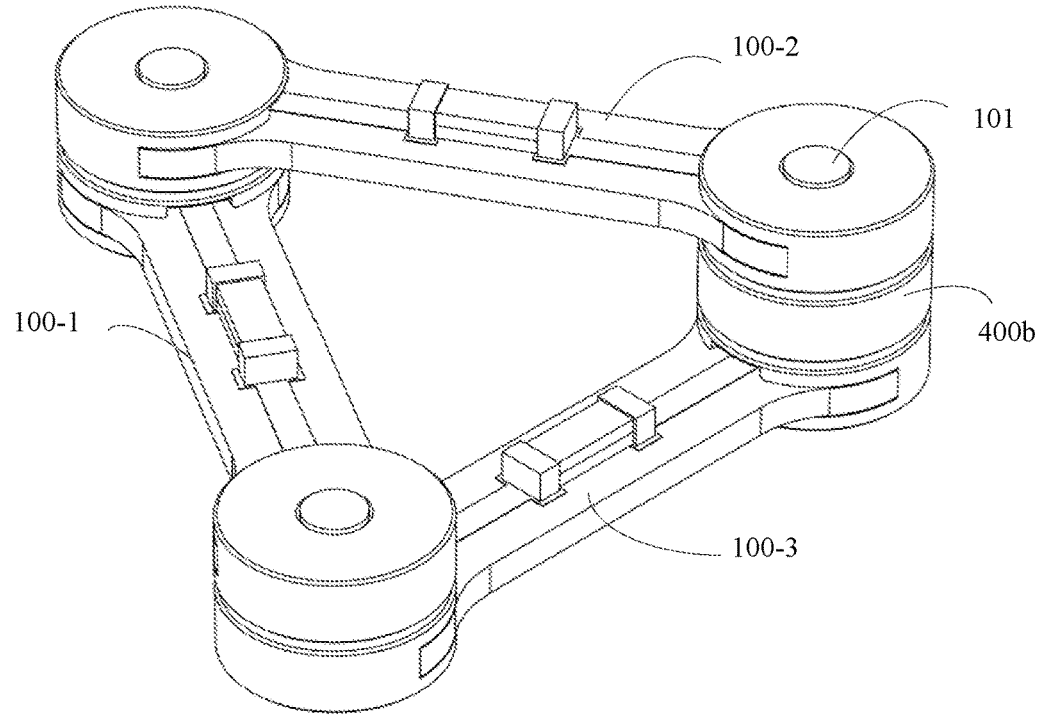
FIG. 22 illustrates a perspective view of another exemplary modular electronic building system consistent with various disclosed embodiments.

FIG. 22 is a perspective view of an exemplary modular electronic building system. As shown in FIG. 22, the exemplary system may include three bone-like modules 100-1 to 100-3 and a filler module 400b. The base module of the three bone-like modules may be module 100b. The filler module 400b fills in the blank space between respective pin portions 12 of module 100-2 and 100-3. In some embodiments, the magnetic member 3 of the filler module 400b may conduct electricity between the magnetic members 3 of module 100-2 and 100-3, such that the two modules are electrically connected.

Due to stable structure of triangle, three bone-like modules and a filler module may form a fixed-shape of triangle as shown in FIG. 22. In some embodiments, each module (modules 100-1, 100-2, 100-3, and filler module 400b) have uniform thickness. The exemplary system shown in FIG. 16 may have three height levels, with modules 100-2 at the highest level, module 100-1 and filler module 400b at the middle level, and module 100-3 at lowest level. Further, pin portions 12 of module 100-2 and module 100-3 at point 101 may locate at a same horizontal position, but at different height level in vertical direction. Thus, the filler module 400b is placed in between module 100-2 and 100-3 to make up their height difference.

Figure 23:
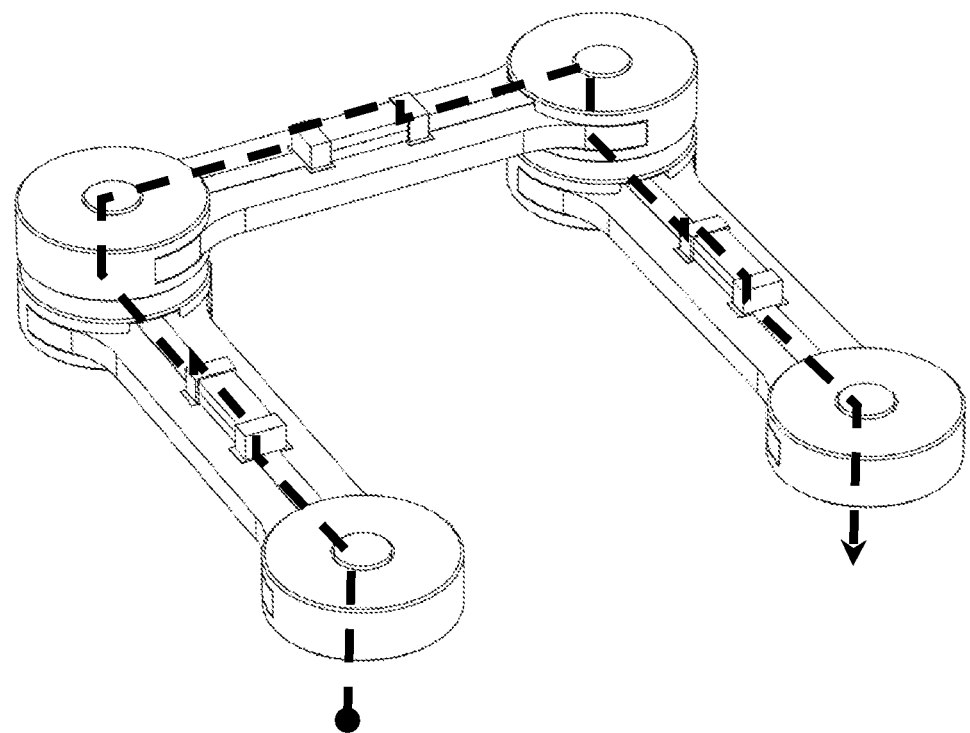
FIG. 23 illustrates a perspective view of another exemplary modular electronic building system consistent with various disclosed embodiments.

FIG. 23 is a perspective view of an exemplary modular electronic building system. As shown in FIG. 23, the exemplary system may include three bone-like modules 100-1, 100-2, and 100-3 sequentially connected in series. The base module of the three bone-like modules may be module 100b. The dotted line illustrates current flow 7 in the circuit, which sequentially passes through module 100-1, module 100-2, and module 100-3.

Figure 24:
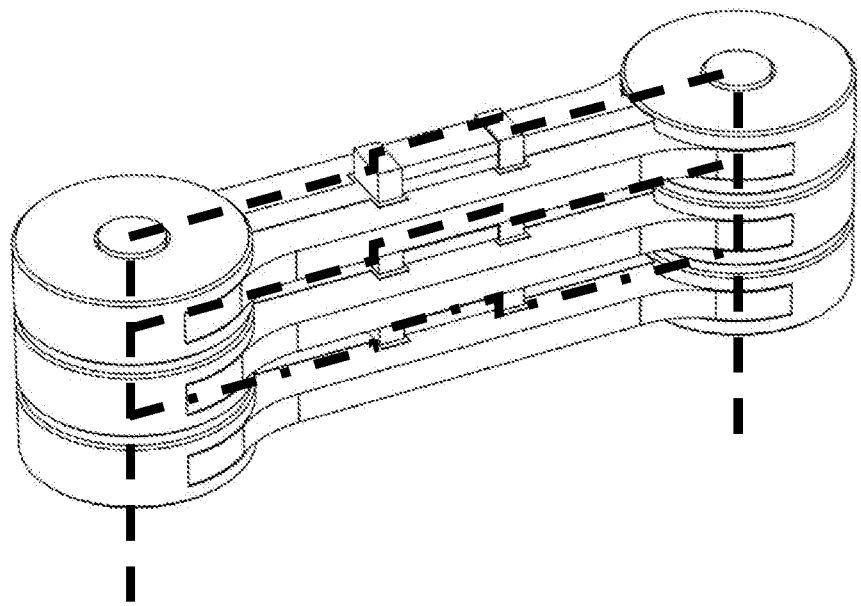
FIG. 24 illustrates a perspective view of another exemplary modular electronic building system consistent with various disclosed embodiments.

FIG. 24 is a perspective view of an exemplary modular electronic building system. As shown in FIG. 24, the exemplary system may include three bone-like modules 100-1, 100-2, and 100-3 sequentially connected in parallel. The base module of the three bone-like modules may be module 100b. The dotted line illustrates current flow 7 in the circuit, which passes through module 100-1, module 100-2, and module 100-3 in parallel.

Figure 25:
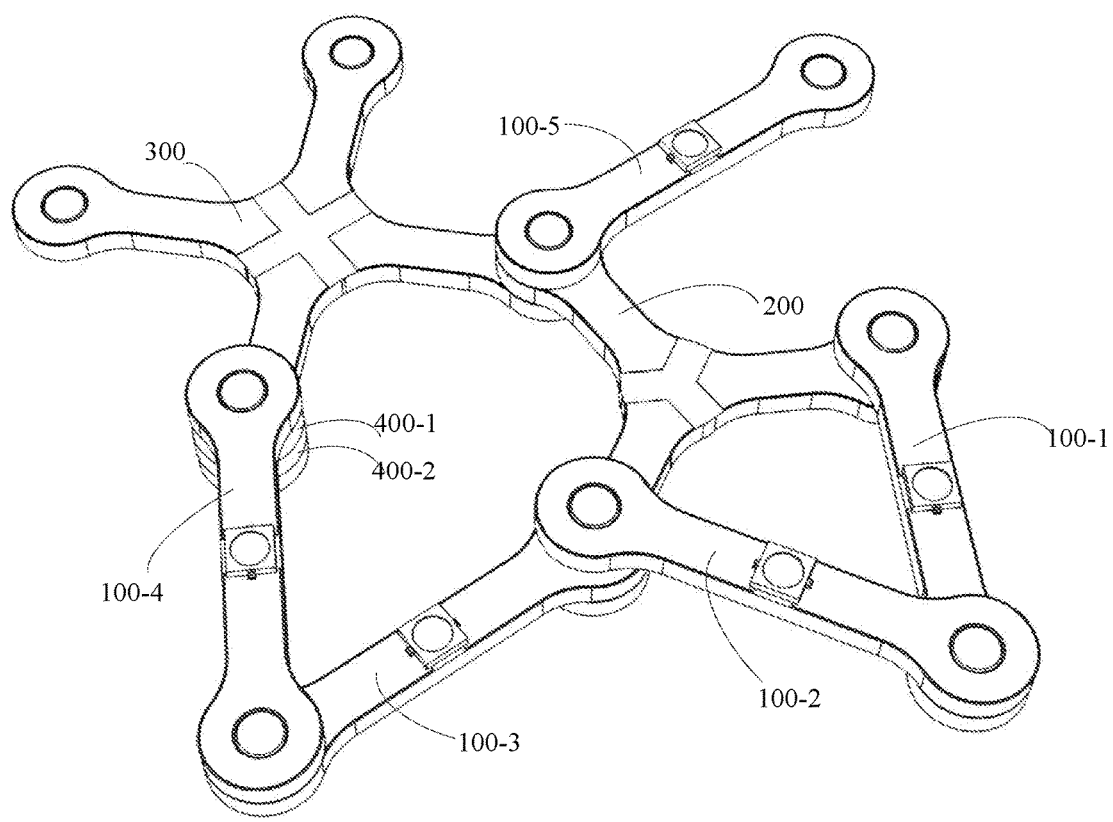
FIG. 25 illustrates a perspective view of another exemplary modular electronic building system consistent with various disclosed embodiments.

FIG. 25 is a perspective view of an exemplary modular electronic building system. As shown in FIG. 25, the exemplary system may include five bone-like modules 100-1 to 100-5, a three-pin module 200, a four-pin module 300, and two filler modules 400-1 and 400-2. The base module of the multi-pin modules may be module 100a. In some embodiments, when each module in the system have uniform thickness, the illustrated system may include four height levels. Sequentially arranged from high to low, the first level includes module 100-1 and module 100-4, the second level includes module 100-1, 100-3, 100-5, and filler module 400-1, the third level includes module 200 and filler module 400-2, and the fourth level includes module 300. To compensate the height difference between module 100-4 and module 300, two filler modules 400-1 and 400-2 are filled in.

FIGS. 19-25 only illustrate several examples of the disclosed modular electric building block system. The disclosed modules (multi-pin modules and filler module) may be conveniently connected to each other and realize various circuit functions. Further, with the disclosed connection mechanism, the modules may expand in both vertical direction and horizontal direction. Moreover, the angles between connecting modules may be freely adjusted as desired. These features may inspire great creative and interesting designs.

In various embodiments, the disclosed modular electric building block system may be coupled with and accommodate any types of building block systems (including toy building block systems), to which the pin portions 12 of the modules intended to couple, in any suitable manner.

In this manner, standalone modules are provided that may enable users, with little or no electronics or programming experience, to construct basic and complex products such as sensors, and/or interaction-based analog and digital circuits. The disclosed modules may be reusable, re-arrange-able, and scalable from small and simple circuits to large and complex circuits, and may be sophisticated enough to allow for complex design of behavior through manipulating tangible modules. For example, the pin portion 12 of an electrical module may have a small size comparable with a US quarter coin.

Additionally, the modules may be transformed into a collection of electronic components that can be used to create bigger and more complex components or systems. Indeed, a user/player/maker can expand the module collection almost indefinitely, adding any new component that they wish to use to their module repository. Users can even create their own modules and add them to the rest of the collection.

In various embodiments, a modular electric building block system including a desired number of modules may be commercialized as a single kit or set. The kit may include one or more different modules or different types of modules, and a container in which to store these modules, and may further include accessories, instructions, or other suitable components. The kit may include a number of modules that may be intended to be assembled in a number of combinations, including a single combination, to perform a number of functions. The kits may also be directed to a certain age group, with a kit for the elementary level including fewer and/or less complicated modules than a kit designed for the high school level, for example.

Therefore, hundreds of other combinations are possible with different modules having different functionality all forming different circuits, with immediate response of the elements, and without any need for programming, soldering or circuit assembly. The user is able to design behavior of the circuit by manipulating physical elements and without any code writing.

The pre-programmed and pre-assembled modules may be selected from the module collection to enable complex prototypes and circuits built as a modular electric building block system with no programming or electronics knowledge. In addition, each module can have different colors to further distinguish from one another and to bring users with better experience.

Further, users may create their own functional module by using specific applications to copy pre-written code into the modules without requiring expertise in the logic of programming and circuit building. For example, all desirable program coding may be pre-prepared for users to copy from a network (e.g., a website) and to paste into the module using blue-tooth connections.

Even further, products or objects may be built with lights, sounds, buttons and other electronic components very easy to kids, young students, designers, non-engineers, and others lacking necessary experience. Electronics become more accessible to non-experts in a cost effective manner. The disclosed modules and systems may provide a platform to enhance learning, enable experimentation and promote innovation.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An electrical module, comprising:
   a housing member including N pin portions and a connecting portion that connects the N pin portions, wherein N is an integer equal or greater than 2;
   N conduction members unconnected with each other; and
   N magnetic members; wherein:
   each pin portion is a plate having a through-hole towards a thickness direction of the plate, and corresponds to one conduction member and one magnetic member;
   each conduction member includes: a first part on a surface of the housing member electrically connected with a lead of an electrical component; and a second part on an inner wall of the through-hole of the corresponding pin portion electrically connected with the corresponding magnetic member;
   each magnetic member fills the through-hole of the corresponding pin portion, and to establish magnetic connection with a magnetic member of another electrical module in the thickness direction to allow the electrical module and the another electrical module to contact each other and rotate against each other using a contacting point as a rotation pivot; and
   each magnetic member includes an upper part having a cylinder shape and extruding out of the top surface of the corresponding pin portion, a middle part having a cylinder shape and filling the through-hole of the corresponding pin portion, and a lower part having a cylinder shape and extruding out of the bottom surface of the corresponding pin portion, a radius of the middle part is the same as the radius of the through-hole of the corresponding pin portion, and a radius of each of the upper and lower parts is smaller than the radius of the middle part.

2. The electrical module according to claim 1, wherein:
   each magnetic member is electrically conductive to allow electrical connection with the magnetic member of the another electrical module when the magnetic connection is established.

3. The electrical module according to claim 1, wherein:
   the electrical component includes N leads, and
   each lead of the electrical component is electrically connected to a corresponding conduction member.

4. The electrical module according to claim 1, wherein:
   the N pin portions are radially distributed around a center of the housing member;
   a cross-section of the housing member has a rotationally symmetric shape; and
   an angle formed between two neighboring pin portions at the center of the housing member is about 360/N degrees.

5. The electrical module according to claim 1, wherein:
   a cross-section of the through-hole of the each pin portion is circular; and
   a part of the each magnetic member inside the through-hole has a cylinder shape compatible with the through-hole.

6. An electrical module, comprising:
   a housing member including two pin portions and a connecting portion that connects the two pin portions;
   two magnetic members; and
   two sleeves slide on the two pin portions respectively; wherein:
   each pin portion is a plate having a through-hole towards a thickness direction of the plate, and corresponds to one magnetic member and one sleeve;
   each magnetic member fills the through-hole of the corresponding pin portion, and to establish magnetic connection with a magnetic member of another electrical module in the thickness direction to allow the electrical module and the another electrical module to contact each other and rotate against each other using a contacting point as a rotation pivot;
   the magnetic member extrudes out of a top surface of a corresponding pin portion, and extrude out of a bottom surface of the corresponding pin portion;
   the sleeve covers the top surface and the bottom surface of the corresponding pin portion and exposes a top surface and a bottom surface of the magnetic member; and
   the pin portion further includes an edge part that forms an edge of the housing member and an inner part that connects with the connecting portion, a shape of the edge part is a half cylinder including a first half of the through-hole, a shape of the inner part is a half cylinder including a second half of the through-hole and having a radius greater than the radius of the edge part, and two rectangles are formed at connecting locations of the inner part and the edge part, each with a length same as a thickness of the pin portion.

7. The electrical module according to claim 6, further comprising two conduction members each including:
   a first part on a surface of the housing member electrically connected with a lead of an electrical component; and a second part on an inner wall of the through-hole of the corresponding pin portion electrically connected with the corresponding magnetic member;

wherein:

the magnetic member is electrically conductive to allow electrical connection with the magnetic member of the another electrical module when the magnetic connection is established.

8. The electrical module according to claim 6, wherein:

the each magnetic member includes an upper part having a cylinder shape and extruding out of the top surface of the corresponding pin portion, a middle part having a cylinder shape and filling the through-hole of the corresponding pin portion, and a lower part having a cylinder shape and extruding out of the bottom surface of the corresponding pin portion;

a radius of the middle part is the same as the radius of the through-hole of the corresponding pin portion;

a radius of the upper part is smaller than the radius of the middle part; and a radius of the lower part is smaller than the radius of the middle part.

9. The electrical module according to claim 8, wherein:

each sleeve includes a top case, a bottom case, a lateral shell that connects the top case and the bottom case, and a lateral opening;

a first through-holes is configured at a center of the top case and has a same radius as the upper part of the magnetic member;

a second through-holes is configured at a center of the bottom case and has a same radius as the lower part of the magnetic member;

a height of the sleeve is the same as a height of the corresponding magnetic member; and a height of the lateral opening is the same as a thickness of the corresponding pin portion.

10. The electrical module according to claim 9, wherein:

an upper groove concaves a bottom of the top case from the first through-hole to an edge of the top case, wherein a width of the upper groove is the same as the radius of the upper part of the magnetic member; and a lower groove concaves a top of the bottom case from the second through-hole to an edge of the bottom case, wherein a width of the lower groove is the same as the radius of the lower part of the magnetic member.

11. The electrical module according to claim 7, wherein:

a notch is configured at a center of an outer rim of the pin portion in the thickness direction.

\* \* \* \* \*